United States Patent [19]
Kijima et al.

[11] Patent Number: 6,162,293
[45] Date of Patent: *Dec. 19, 2000

[54] METHOD FOR MANUFACTURING FERROELECTRIC THIN FILM, SUBSTRATE COVERED WITH FERROELECTRIC THIN FILM, AND CAPACITOR

[75] Inventors: Takeshi Kijima, Oomiya; Akira Okutoh, Kobe; Maho Ushikubo, Kashiwa; Hironori Matsunaga, Noda, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/993,717

[22] Filed: Dec. 18, 1997

[30] Foreign Application Priority Data

Dec. 20, 1996 [JP] Japan ................................ 8-355320

[51] Int. Cl.⁷ ........................................ C30B 25/14
[52] U.S. Cl. ........................... 117/104; 117/89; 117/95; 117/102; 117/945
[58] Field of Search ................................ 117/104, 102, 117/95, 89, 945

[56] References Cited

U.S. PATENT DOCUMENTS 5,683,614 11/1997 Boyle .............................. 252/62.9 R
5,801,105 9/1998 Yano et al. ...................... 438/785
5,821,005 10/1998 Kijima et al. .................... 428/701

FOREIGN PATENT DOCUMENTS

0747938A2 12/1996 European Pat. Off. .
8-161933 6/1996 Japan .
8-306231 11/1996 Japan .
9-186376 7/1997 Japan .

OTHER PUBLICATIONS

"Preparation of C–Axis–Oriented $Bi_4Ti_3O_{12}$ Thin Films by Metalorganic Chemical Vapor Deposition", by T. Nakamura et al., Jpn. J. Appl. Phys. vol. 32 (1993) Part 1, No. 9B, Sep1993 pp. 4086–4088. .

"Preparation of $Bi_4Ti_3O_{12}$ Thin Films with c–axis Orientation by MOCVD Using $Bi(o-C_7H_7)_3$ and $Ti(i-OC_3H_7)_2(DPM)_2$" by K. Yoshimura et al., Journal of the Ceramic Society of Japan 102 (1994) pp. 512–515.

Rusul Muhammet, et al, Effects of Oxygen Concentration on Growth of Bi4T13O12 Thin Films by Metalorganic Chemical Vapor Deposition, Jpn. J. Appl. Phys. vol. 33 (1994) pp. 5215–5218, Part 1, No. 9B, Sep. 1994.

"Effects of Oxygen Concentration of Growth of $Bi_4Ti_3O_{12}$ Thin Films by Metalorganic Chemical Vapor Deposition", by T. Muhammet et al., Jpn. J. Appl. Phys. vol. 33 (1994) Part 1, No. 9B, Sep. 1994 pp. 5215–5218.

"Preparation and Properties of $Bi_4Ti_3O_{12}$ Thin Films by Electron Cyclotron Resonance Sputtering" by H. Maiwa et al., 10th International Symposium, (1996) pp. 455–458.

"Ultra–Thin Fatigue–Free $Bi_4Ti_3O_{12}$ Films for Nonvolatile Ferroelectric Memories", by T. Kijima et al., Jpn. J. Appl. Phys. vol. 35 (1996) Part 1, No. 2B, Feb. 1996 pp. 1246–1250.

*Primary Examiner*—Robert Kunemund
*Attorney, Agent, or Firm*—Birch, Stewart, Kolasch & Birch, LLP

[57] ABSTRACT

A method for manufacturing a ferroelectric thin film having a layered perovskite crystal structure of the general formula: $Bi_2A_{m-1}B_mO_{3m+3}$, wherein A is selected from the group consisting of $Na^{1+}$, $K^{1+}$, $Pb^{2+}$, $Ca^{2+}$, $Sr^{2+}$, $Ba^{2+}$ and $Bi^{3+}$, B is selected from the group consisting of $Fe^{3+}$, $Ti^{4+}$, $Nb^{5+}$, $Ta^{5+}$, $W^{6+}$ and $Mo^{6+}$, and m represents an integer of 1 or larger, which comprises introducing into a film formation chamber where a substrate is set, gaseous starting materials inclusive of oxygen gas for forming the ferroelectric thin film in which the flow rate of oxygen gas as one component of the gaseous starting materials is controlled to an arbitrary value necessary for the formation of the ferroelectric thin film having a desired orientation while the pressure inside the film formation chamber and the total flow rate of the gaseous starting materials and an optionally introduced carrier gas are maintained constant.

12 Claims, 9 Drawing Sheets

(1) Film having preferential orientation along c-axis

Fig. 5(2)

(2) Film having random orientation

Fig. 5(3)

(3) Film having preferential orientation along (117)

FIG.6

(1) Film having preferential orientation along c-axis (2) Film having random orientation (3) Film having preferential orientation along (117)

METHOD FOR MANUFACTURING FERROELECTRIC THIN FILM, SUBSTRATE COVERED WITH FERROELECTRIC THIN FILM, AND CAPACITOR

BACKGROUND OF THE INVENTION

1. Field of the Invention

The present invention relates to method for manufacturing ferroelectric thin film, substrate covered with ferroelectric thin film, and capacitor. A substrate covered with a ferroelectric thin film and a capacitor are used a ferroelectric memory device, a pyroelectric sensor, a piezoelectric device or the like.

2. Related Art

Ferroelectrics have been widely used for the development of devices such as a condenser, an oscillator, an optical modulator and an infrared sensor since ferroelectrics have a variety of characteristics such as spontaneous polarization, high dielectric constant, electro-optical effect, piezoelectric effect and pyroelectric effect.

With the advance in the technique of forming thin films, the application field of ferroelectric thin film is expanding. For example, reduction of capacitor area for high integration of devices and improvement of reliability have been achieved by applying the high dielectric characteristics to various kinds of semiconductor devices such as a DRAM. Furthermore, particularly recently, the development of ferroelectric non-volatile memories (FRAMs) having high density and high operation speed has been active by combining them with semiconductor memory devices such as a DRAM. Ferroelectric non-volatile memories eliminate the need for back-up power supply by utilizing the ferroelectric properties (hysteresis effect) of the ferroelectrics. For the development of such devices, it is necessary to use a material having characteristics such as large remanent spontaneous polarization (Pr), small coercive field (Ec), small leakage currents, and large resistance to repetition of polarization inversion. Further, it is desired to realize the above properties with a thin film having a thickness of 200 nm or less so as to reduce the operation voltage and to conform to fine processing of semiconductors.

For the purpose of applying thin films to FRAM or the like, study is under way on the formation of high quality thin film of ferroelectrics comprising a group of bismuth-based oxides having a layer crystal structure and expressed by the following general formula:

where, A is selected from $Na^{1+}$, $K^{1+}$, $Pb^{2+}$, $Ca^{2+}$, $Sr^{2+}$, $Ba^{2+}$, $Bi^{3+}$, etc.; B is selected from $Fe^{3+}$, $Ti^{4+}$, $Nb^{5+}$, $Ta^{5+}$, $W^{6+}$, $Mo^{6+}$, etc.; and m represents an integer of 1 or larger. Concerning their crystal structure, the bismuth-based oxides comprise a layered perovskite layer consisting of a sequence of (m−1) units of $ABO_3$ perovskite lattices interposed between $(Bi_2O_2)^{2+}$ layers. Among the group of materials, those comprising a combination of Sr, Ba, or Bi for A-site and Ti, Ta, or Nb for B-site tend to exhibit ferroelectric properties.

In the ferroelectrics expressed by the general formula above, $Bi_4Ti_3O_{12}$ (bismuth titanate) has a layered perovskite structure (rhombic crystal/lattice constants : a=5.411 Å, b=5.448 Å, and c=32.83 Å) with strong anisotropy. The ferroelectric property of its single crystal is such that, along the a-axis, the remanent spontaneous polarization is Ps=50 $\mu C/cm^2$ and the coercive field is Ec=50 kV/cm; and, along the c-axis, the remanent spontaneous polarization is Ps=4 $\mu C/cm^2$ and the coercive field is Ec=4 kV/cm. Thus, among the bismuth-based oxide ferroelectrics, bismuth titanate exhibits the greatest a-axis component of spontaneous polarization and an extremely small c-axis component of the coercive field. It will be possible to apply this ferroelectric to electronic devices such as ferroelectric non-volatile memories if the orientation of thin films can be controlled suitable for utilizing the properties of large spontaneous polarization and small coercive field which $Bi_4Ti_3O_{12}$ has. However, the cases that have been reported so far utilize only the c-axis orientation along which the spontaneous polarization is small, or the random orientation. Thus, the large spontaneous polarization along the a-axis has not been fully utilized to the present.

On the other hand, formation of a thin film using $Bi_4Ti_3O_{12}$ has been attempted by employing MOCVD (metal-organic chemical vapor deposition) or sol-gel method. However, a conventional sol-gel method for forming a thin film with favorable ferroelectric properties requires thermal treatment at a temperature of 650° C. or higher, and, moreover, most of the thin films thus obtained exhibit random orientation or c-axis orientation. Furthermore, the surface morphology of the resulting thin film revealed that the thin film consists of crystal particles about 0.5 $\mu m$ in size. Thus, the film was found difficulties in applying it to highly integrated semiconductor devices which require fine processing.

On the other hand, thin films of $Bi_4Ti_3O_{12}$ having c-axis orientation is being formed at a temperature of 600° C. or higher on a Pt-electrode layer/$SiO_2$/Si-substrate (Pt/$SiO_2$/Si substrate) or on a Pt substrate by MOCVD method. However, these substrates cannot be applied to semiconductor devices directly as they are. More specifically, as is the case with the Pt/$SiO_2$/Si substrate, a bonding layer such as a Ti film must be formed between the Pt electrode layer and the underlying $SiO_2$ in order to ensure the bonding strength between the Pt electrode layer and the $SiO_2$.

However, it has been reported that, if a $Bi_4Ti_3O_{12}$ thin film is formed by MOCVD on the Pt electrode layer having a bonding layer as above, the film surface tends to exhibit, not only a morphology consisting of coarse crystal particles, but also a tendency of generating pyrochlore phase ($Bi_2Ti_2O_7$) [see *Jpn. J. Appl. Phys.*, 32 (1993), p.4086, and *J. Ceramic Soc. Japan*, 102 (1994), p.512]. If the film surface morphology consists of coarse crystal particles, the thin film cannot be applied to a highly integrated device which is subjected to fine processing. Moreover, in case films are too thin, they tend to cause pinholes which lead to the generation of current leakage. Furthermore, the incorporation of a non-ferroelectric phase, i.e., pyrochlore phase, deteriorates the ferroelectric properties of the entire thin film. Accordingly, it was difficult to form a ferroelectric thin film having good ferroelectric properties with a thickness of 200 nm or less by a conventional technique.

*Jpn. J. Appl. Phys.*, 33(1994) p.5215–5218 discloses that at the film formation temperature 600° C. or higher, $Bi_4Ti_3O_{12}$ having an orientation along c-axis can be obtained at the specific flow rate of oxygen gas. However, it discloses that at the flow rate of oxygen gas except the above-mentioned flow rate, $Bi_4Ti_3O_{12}$ mixed with the one having an orientation along (117) can be obtained. That is, it was difficult to control the orientation of $Bi_4Ti_3O_{12}$ thin film optionally.

As described above, the conventional techniques for forming thin films involve problems that the large spontaneous polarization of $Bi_4Ti_3O_{12}$ along the a-axis has not been used to the full extent, and that the density and the flatness of the film surface necessary for fine processing and suppressing current leakage in view of applying the ferroelectric thin film to highly integrated devices has not been obtained. Moreover, because the film surface morphology of a $Bi_4Ti_3O_{12}$ thin film having c-axis orientation reported to the present consists of coarse crystal particles, a thin film cannot sufficiently prevent current leakage from generating.

To implement the ferroelectric non-volatile memory (FRAM) having high capacity, the large spontaneous polarization of $Bi_4Ti_3O_{12}$ along the a-axis is effective for the reduction of capacitor area; and, to realize low voltage drive, a small coercive field in along the c-axis is effective. However, conventional methods of film formation had been found unable to fully utilize the aforementioned characteristics of $Bi_4Ti_3O_{12}$.

SUMMARY OF THE INVENTION

The present invention has been accomplished with an aim to solve the aforementioned problems, and it provides a well-controlled method for manufacturing a ferroelectric thin film which controls the ferroelectric properties and enables a dense thin film having a planarized surface by controlling the orientation of the ferroelectric thin film, thereby implementing a ferroelectric thin film having a large spontaneous polarization along the a-axis and a small coercive field in along the c-axis even in case the thin film is provided as thin as 200 nm or less in film thickness. Another object of the present invention is to provide ferroelectric thin films each having electric properties depending on the usage of the film.

Thus, the present invention is provided a method for manufacturing a ferroelectric thin film having a layered perovskite crystal structure of the general formula: $Bi_2A_{m-1}B_mO_{3m+3}$, wherein A is selected from the group consisting of $Na^{1+}$, $K^{1+}$, $Pb^{2+}$, $Ca^{2+}$, $Sr^{2+}$, $Ba^{2+}$ and $Bi^{3+}$, B is selected from the group consisting of $Fe^{3+}$, $Ti^{4+}$, $Nb^{5+}$, $Ta^{5+}$, $W^{6+}$ and $Mo^{6+}$, and m represents an integer of 1 or larger, which comprises introducing into a film formation chamber where a substrate is set, gaseous starting materials inclusive of oxygen gas for forming the ferroelectric thin film in which the flow rate of oxygen gas as one component of the gaseous starting materials is controlled to an arbitrary value necessary for the formation of the ferroelectric thin film having a desired orientation while the pressure inside the film formation chamber and the total flow rate of the gaseous starting materials and an optionally introduced carrier gas are maintained constant.

Also, the present invention is provided a substrate covered with a ferroelectric thin film formed by the method of described above.

Further, the present invention is provided a capacitor comprising a lower electrode of an electrically conductive material formed on a substrate; a ferroelectric thin film formed on the lower electrode by the method of described above; and an upper electrode of an electrically conductive material formed on the uppermost layer of the ferroelectric thin film.

BRIEF DESCRIPTION OF THE DRAWINGS

FIGS. 5(1) to 5(3) show each a SEM photograph of the $Bi_4Ti_3O_{12}$ thin film produced in Example 2;

FIGS. 7(1) to 7(3) each show a hysteresis curve obtained on the $Bi_4Ti_3O_{12}$ thin film produced in Example 2;

DESCRIPTION OF THE PREFERRED EMBODIMENTS

The method for manufacturing the ferroelectric thin film is described below.

The method for manufacturing the ferroelectric thin film according to the present invention comprises introducing the gaseous starting materials for the ferroelectrics into the film formation chamber, and in that case, the pressure inside the film formation chamber and the total flow of the gaseous starting materials and the arbitrarily introduced carrier gas are maintained constant; thus, the ferroelectric thin film is formed by changing the flow rate of oxygen gas ($O_2$) included in the gaseous starting materials.

As substrates usable in the present invention, included are semiconductor substrates such as a silicon substrate and a GaAs substrate; metallic substrates such as a Pt substrate and an Ir substrate; and insulating substrates such as a sapphire substrate or a substrate made of MgO, $SrTiO_3$, $BaTiO_3$, or $PbTiO_3$, etc. On a semiconductor substrate, furthermore, there may be provided, for instance, an insulating film such as a $SiO_2$ or a SiNx, which may have further thereon a metallic layer of, e.g., Pt, Al, Au, Ir, or Ru; or an oxide conductive layer of, e.g., $RuO_2$ or $IrO_2$. A bonding layer of Ti, Ta, etc., may be provided additionally to ensure binding strength between the insulating film and the metallic layer. The insulating film above can be formed by means of thermal oxidation, sputtering, etc., and the metallic layer as well as the bonding layer can be formed by sputtering, etc.

Then, a ferroelectric thin film is formed on the substrate. The ferroelectric thin film according to the present invention is expressed by the general formula $Bi_2A_{m-1}B_mO_{3m+3}$. Specifically mentioned as ferroelectric thin films include $Bi_4Ti_3O_{12}$, $SrBi_2Nb_2O_9$, $SrBi_2Ta_2O_9$, $BaBi_2Nb_2O_9$, and $BaBi_2Ta_2O_9$. Preferred among them are $Bi_4Ti_3O_{12}$ and $SrBi_2Ta_2O_9$, and particularly preferred is $Bi_4Ti_3O_{12}$.

Gaseous starting materials include oxygen gas and any gas which is obtained by heating and gassifying an organo or inorgano-metallic starting material capable of generating Pb, Sr, Ba, Bi, Ti, Nb, or Ta in conducting metal-organic or inorganic chemical vapor deposition (MOCVD). More specifically, included are starting materials for Pb, such as $PbCl_2$, $Pb(CH_3)_4$, $Pb(C_2H_5)_4$, $Pb(n-C_3H_7)_4$, $Pb(i-C_3H_7)_4$, $Pb(C_6H_5)_4$, $Pb(C_2H_5)_3OCH_2C(CH_3)_3$, or $Pb(thd)_2$ (where, "thd" represents "$((CH_3)_3CCO)_2CH-$"; starting materials for Sr, such as $SrCl_2$, $Sr(C_2H_5)_2$, $Sr(C_5(CH_3)_5)_2$, or $Sr(thd)_2$; starting materials for Ba, such as $BaCl_2$, $Ba(C_2H_5)_2$, $Ba(C_5(CH_3)_5)_2$, or $Ba(thd)_2$; starting materials for Bi, such as $BiH_3$, $BiCl_3$, $BiBr_3$, $BiI_3$, $Bi(CH_3)_3$, $Bi(C_2H_5)_3$, $Bi(n-C_3H_7)_3$, $Bi(n-C_4H_9)_3$, $Bi(i-C_4H_9)_3$, $Bi(n-C_5H_{11})_3$, $Bi(C_6H_5)_3$, $Bi(2-CH_3C_6H_4)_3$, $Bi(4-CH_3C_6H_4)_3$, $Bi(OCH_2CH_2N(CH_3)_2)_3$, $Bi(OCHCH_3CH_2N(CH_3)_2)_3$, or Bi(OC(CH$_3$)$_2$CH$_2$CH$_3$)$_3$; starting materials for Ti, such as TiCl$_4$, Ti(C$_2$H$_5$)Cl$_2$, Ti(OCH$_3$)$_4$, Ti(OC$_2$H$_5$)$_4$, Ti(O—n—C$_3$H$_7$)$_4$, Ti(O—n—C$_4$H$_9$)$_4$, Ti(O—t—C$_4$H$_9$)$_4$, Ti(O—n—C$_5$H$_{11}$)$_4$, Ti(thd)$_2$, or TiCl$_2$(thd)$_2$; starting materials for Nb, such as NbCl$_5$, Nb(C$_5$H$_5$)Cl$_4$, Nb(OCH$_3$)$_5$, Nb(OC$_2$H$_5$)$_5$, Nb(O—n—C$_3$H$_7$)$_5$, Nb(O—i—C$_3$H$_7$)$_5$, Nb(O—n—C$_4$H$_9$)$_5$, Nb(O—t—C$_4$H$_9$)$_5$, or Nb(O—n—C$_5$H$_{11}$)$_5$; and starting materials for Ta, such as TaCl$_5$, Ta(C$_5$H$_5$)Cl$_4$, Ta(OCH$_3$)$_5$, Ta(OC$_2$H$_5$)$_5$, Ta(O—n—C$_3$H$_7$)$_5$, Ta(O—i—C$_3$H$_7$)$_5$, Ta(O—n—C$_4$H$_9$)$_5$, Ta(O—t—C$_4$H$_9$)$_5$, or Ta(O—n—C$_5$H$_{11}$)$_5$.

The starting organo or inorgano-metallic materials above can be used as it is in case they can be introduced without any problem into the film forming chamber; however, in case difficulties are found in the introduction, it is preferred that a means for heating and/or bubbling or the like is used to volatilize the material, and that the materials are then introduced by using a carrier gas such as gaseous argon or N$_2$.

The pressure inside the film formation chamber is controlled properly to maintain a constant value, and this value depends on the gaseous starting materials to be used, as well as on the conditions such as the temperature of film formation, etc.; however, preferred is to maintain the pressure in the range of from 2 to 10 Torr. Furthermore, the temperature of film formation is preferably in the range of from 400 to 650° C.

The present invention is characterized in one aspect that the flow rate of oxygen gas incorporated in gaseous starting materials changes. By changing the flow rate of oxygen gas, Bi$_4$Ti$_3$O$_{12}$ can be obtained in the desired crystal structure, i.e., Bi$_4$Ti$_3$O$_{12}$ ranging from preferential orientation along c-axis to random orientation, and preferential orientation along the crystallographic (117) direction (hereinafater sometimes referred to simply as "preferential orientation along (117)") can be formed. In case of forming a Bi$_4$Ti$_3$O$_{12}$ ferroelectric thin film, for instance, it can be obtained with preferential orientation along c-axis if the flow rate of oxygen gas is controlled to fall in the range from 20 to 40% by volume with respect to the total flow rate of the gaseous starting materials and the carrier gases that are introduced arbitrarily to the gaseous starting materials, whereas a Bi$_4$Ti$_3$O$_{12}$ ferroelectric thin film having random orientation or a preferential orientation along (117) are obtained by controlling oxygen gas as such that it accounts for 40 to 60% by volume, or by controlling the flow rate as such that it accounts for 60 to 80% by volume.

In addition, the ferroelectric thin film according to the present invention may have two or more layers, and each layer may have the same composition and crystal structure to obtain a multilayered structure. In such a case, the thickness of the lowermost layer preferably is thinner than the thickness of the upper layers. In particular, the temperature for forming the lowermost layer is preferably higher than that for forming the upper layer. By forming the film under such conditions, the ferroelectric thin film for the lowermost layer can be obtained at a desired crystal structure (i.e., the lowermost layer functions as crystal nuclei layer), and by forming the upper layers at a temperature lower than that of the lower layers, a ferroelectric thin film having the same crystal structure as that of the lowermost layer can be formed while suppressing the formation of coarse crystal particles. That is, by forming the film under these conditions, a dense ferroelectric thin film having favorable crystallinity and a planarized surface can be implemented. In case three or more layers constitute the ferroelectric thin film, the flow rate of oxygen can be differed for each of the layers to obtain a multilayered structure comprising layers differing from each other in orientation. For instance, by interposing a ferroelectric thin film having a preferential orientation along (117) between ferroelectric thin films having a preferential orientation along c-axis, a total structure having large spontaneous polarization and a small coercive field can be obtained.

From the viewpoint of lowering the operation voltage and matching with the fine processing step in semiconductors, the ferroelectric thin film is formed preferably as such that a total thickness be 200 nm or less, and particularly preferably, it is formed at a total thickness of from 50 to 100 nm. It is also preferred that the ferroelectric thin film for the lowermost layer has a thickness of from 5 to 10 nm.

It is more preferable to form an oxide layer as a buffer layer between the ferroelectric thin film and the substrate. Oxides usable for the buffer layer preferably contains all or a part of the elements constituting the ferroelectric thin film that is formed thereon. More specifically, mentioned as the materials for use in the buffer layer include titanium oxide, bismuth oxide, Bi$_2$Ti$_2$O$_7$, etc. The thickness of the buffer layer is preferably 10 nm or less, and more preferably, is in the range of from 5 to 10 nm. The buffer layer can be formed by a known method such as MOCVD.

A preferred embodiment according to the present invention comprises, in a constitution having a titanium oxide layer of 10 nm or less in thickness as the buffer layer and a multilayered Bi$_4$Ti$_3$O$_{12}$ as the ferroelectric thin film, forming a ferroelectric thin film for the lowermost layer to a thickness of 10 nm or less at a film formation temperature of from 450 to 650° C., and then forming the upper ferroelectric thin film at a film formation temperature ranging from 400 to 500° C. on the lowermost layer. By following this procedure, a dense ferroelectric thin film having a favorable crystallinity and a planarized surface can be obtained.

The process for forming a Bi$_4$Ti$_3$O$_{12}$ ferroelectric thin film by means of MOCVD on a substrate with a titanium oxide buffer layer interposed therebetween is described below. In accordance with the present invention, it has been found that the orientation of the ferroelectric crystals of the ferroelectric thin film can be changed arbitrarily and with high reproducibility from c-axis preferential orientation to random orientation mainly including c-axis component and (117) component, and to preferential orientation along (117). That is, in forming a ferroelectric thin film, the ratio of the flow rate of the oxygen gas taken with respect to the total flow rate of the gas introduced into the film formation chamber (gaseous starting materials and carrier gas that is introduced if desired) is changed to change the film orientation.

That is, because a film having preferential orientation along (117) and rich in a-axis component can be obtained, the Bi$_4$Ti$_3$O$_{12}$ ferroelectric thin film having larger a-axis component in spontaneous polarization as compared with the conventional films having preferential orientation along c-axis or random orientation can be utilized more effectively. Furthermore, a Bi$_4$Ti$_3$O$_{12}$ film is provided as a lowermost layer which functions as a crystal nuclei layer to accelerate growth of Bi$_4$Ti$_3$O$_{12}$thin film after forming a titanium oxide buffer layer, and a ferroelectric thin film is then formed on the lowermost layer at a film formation temperature lower than that under which the lowermost layer was formed. In this manner, a dense ferroelectric thin film having a planarized surface can be provided because the crystallinity of the Bi$_4$Ti$_3$O$_{12}$thin film can be maintained while suppressing coarsening of crystal particles. With respect to c-axis oriented Bi$_4$Ti$_3$O$_{12}$ thin film advantageous in realizing low voltage drive, the present invention provides a dense $Bi_4Ti_3O_{12}$ thin film having a planarized surface, preferential orientation along c-axis, and favorable crystallinity, which is in contrast to the conventionally reported $Bi_4Ti_3O_{12}$ thin film having preferential orientation along c-axis and a film surface morphology consisting of coarse crystal particles. Furthermore, even in case the film is provided as thin as 200 nm or less in thickness, the formation of pinholes and the like is suppressed that a high quality thin film comprising a $Bi_4Ti_3O_{12}$ thin film having preferential orientation along c-axis and a sufficiently low leak current density can be provided. Thus, the small coercive field in the c-axis direction can be effectively utilized.

Thus, a substrate covered with a ferroelectric thin film having the desired orientation can be obtained by the method for manufacturing a ferroelectric thin film described above.

Furthermore, the present invention provides a capacitor provided with a lower electrode comprising an electrically conductive material formed on a substrate or a buffer layer, a ferroelectric thin film formed on the lower electrode, and an upper electrode comprising an electrically conductive material formed on the ferroelectric thin film.

As electrically conductive materials usable for the lower and the upper electrodes, any material known in the field can be used, and specifically mentioned are Pt and $IrO_2$. For the substrate, buffer layer, and the ferroelectric thin film, the materials described above can be used without any problem.

By using the ferroelectric thin film obtained in accordance with the manufacturing method of the present invention for the capacitor, a capacitor reduced in area and having lower drive voltage can be obtained, and a product well matched to the fine processing technology for semiconductors can be implemented.

The present invention is described in further detail below by referring to non-limiting examples.

EXAMPLE 1

The surface of a silicon single crystal wafer (silicon substrate) was thermally oxidized to form a $SiO_2$ layer, on which a tantalum (Ta) layer and a platinum (Pt) lower electrode layer were formed by means of sputtering in this order.

Then, a 10 nm thick thin film of $Bi_4Ti_3O_{12}$ was formed on the Pt lower electrode by means of MOCVD under the conditions shown in Table 1 while maintaining the substrate at a temperature of 600° C.

The conditions for forming the film are shown specifically in Table 1.

TABLE 1

| | | |
|---|---|---|
| Starting material | $Bi(o-C_7H_7)_3$ | $Ti(i-OC_3H_7)_4$ |
| Temperature of Starting Material | 160° C. | 50° C. |
| Total gas flow rate | 2,500 sccm | |
| Flow rate of Carrier gas inclusive of Gaseous starting materials | 300 sccm | 75 sccm |
| Flow rate of Oxygen Gas | 125 to 2,000 sccm | |
| Flow rate of Gaseous Argon | 2,000 to 125 sccm | |
| Substrate Temperature | 400 and 600° C. | |
| Pressure | 5 Torr | |
| Total Film Thickness | 10, 100, and 120 nm | |

The pressure inside the film formation chamber was controlled to be 5 Torr. Then, a carrier gas (Ar) containing a starting material for Bi (containing the Bi starting material at a concentration of 12%) was introduced into the film formation chamber at a flow rate of 300 sccm, or a carrier gas (Ar) containing a starting material for Ti (containing the Ti starting material at a concentration of 3%) was introduced into the film formation chamber at a flow rate of 75 sccm, while introducing oxygen gas as the reaction gas and gaseous Ar as a balance gas. In this case, the total flow rate of the gas (the carrier gas containing a starting materials for Bi and Ti, oxygen gas and the balance gas) introduced into the film formation chamber was fixed to 2,500 sccm, while changing the flow rate of oxygen gas in the range of from 125 to 2,000 sccm (which accounts for 5 to 80% of the total gas flow rate). Thus was obtained a film by changing the flow rate of gaseous materials (that is, the flow rate of gaseous Ar provided as balance was changed from 2,000 to 125 sccm with changing flow rate of oxygen gas).

Figure 1:
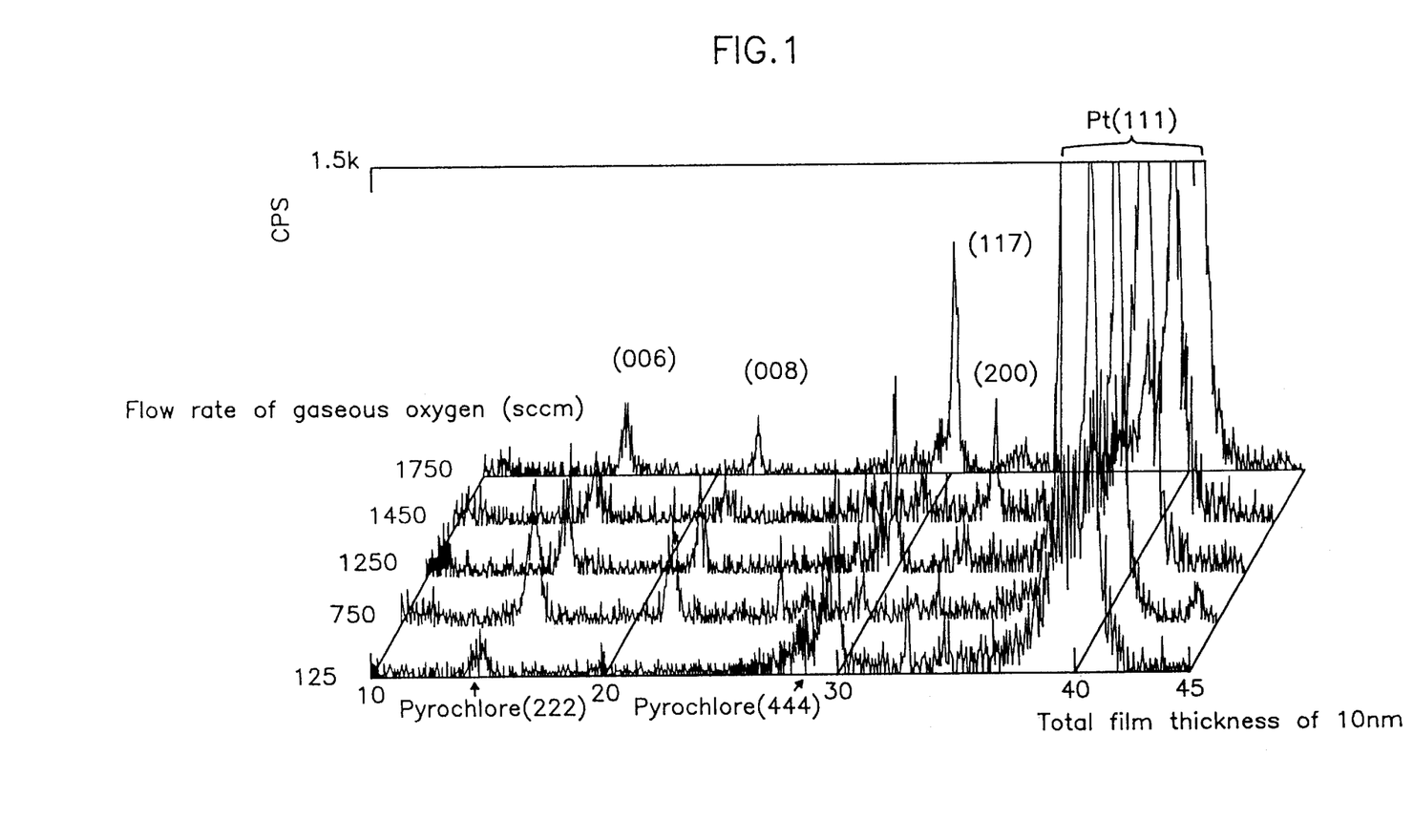
FIG. 1 shows a XRD pattern of the $Bi_4Ti_3O_{12}$ thin film produced in Example 1.

FIG. 1 shows the XRD (X-ray diffraction) patterns obtained for the thus prepared $Bi_4Ti_3O_{12}$ thin film.

Referring to FIG. 1, the XRD pattern obtained for the sample prepared under an oxygen flow of 125 sccm shows the formation of a paraelectric pyrochlore phase. However, perovskite phase as ferroelectric was identified for the samples obtained under an oxygen flow of 750 sccm or higher. The sample obtained under an oxygen flow of 750 sccm exhibits preferential orientation along c-axis, and the samples under an oxygen flow of 1,250 sccm and 1,450 sccm show random orientation. This shows that the c-axis component decreases and that the intensity of (117) reflection inclusive of a-axis component increases with flow rate of oxygen gas. Moreover, preferential orientation along (117) was obtained on the sample obtained under a further increased flow rate of oxygen, i.e., under 1,750 sccm.

That is, it has been found that the crystal structure of the thin film changes from the pyrochlore phase as paraelectric to the perovskite phase as ferroelectric, while changing the orientation from preferential orientation along c-axis to that along (117) direction, via random orientation with increasing flow rate of oxygen gas.

FIG. 1 shows representative XRD patterns, and by performing a further detailed study, it has been found that $Bi_4Ti_3O_{12}$ thin films having preferential orientation along c-axis are obtained with high reproducibility in case the flow rate of oxygen gas accounts for 20 to 40% of a fixed total gas flow rate: that thin films having random orientation result at high reproducibility under a oxygen gas flow that accounts for 40 to 60% of a fixed total gas flow rate; and that thin films having preferential orientation along (117) are obtained with high reproducibility under a oxygen gas flow that accounts for 60 to 80% of a fixed total gas flow rate.

Thus, the present example shows that the formation of films with high reproducibility is possible because conditions such as the flow rate of the gaseous starting materials and the reaction pressure are maintained constant while changing only few parameters.

EXAMPLE 2

Figure 6:
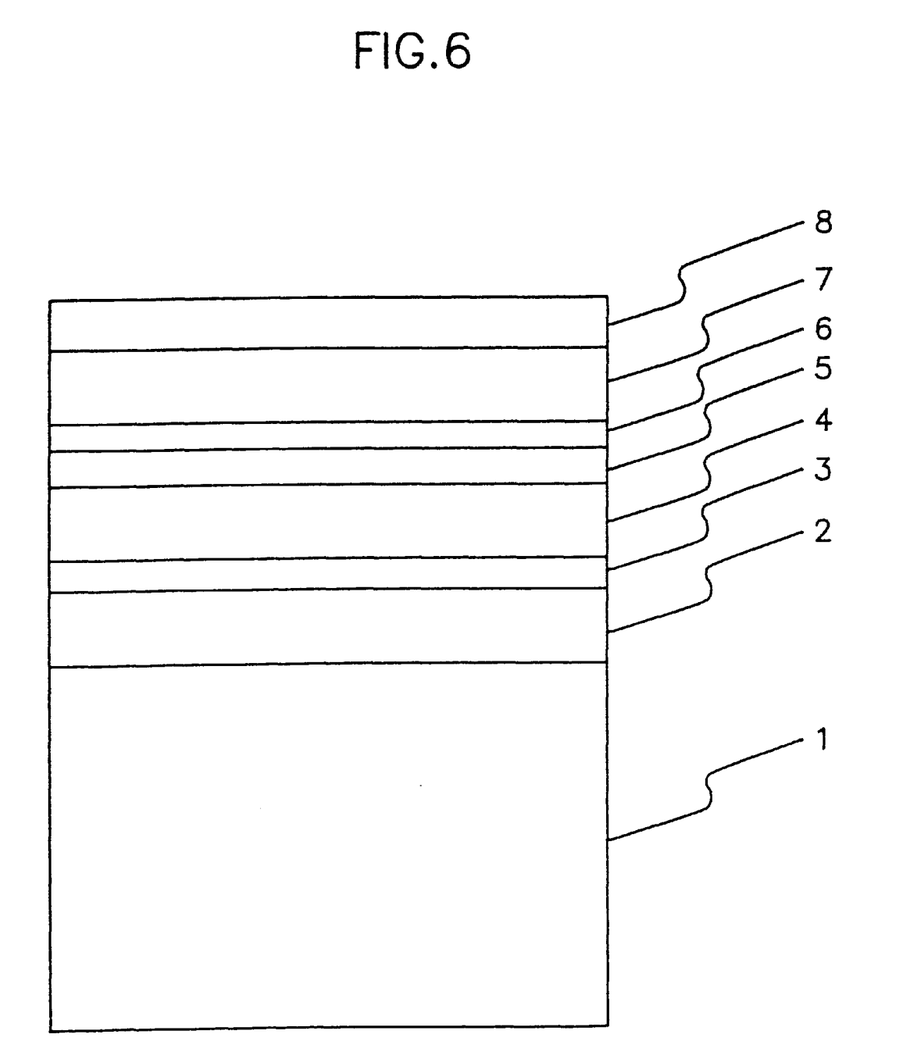
FIG. 6 shows a schematic cross-sectional view of the capacitor according to Example 2.
Figure 7:
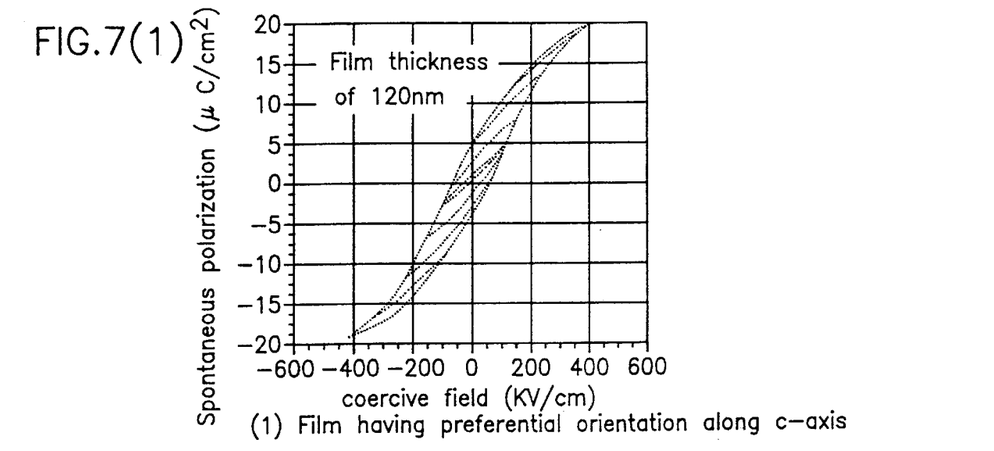

The same structure of [Pt lower electrode 4]/[Ta bonding layer 3]/[Si-substrate 1] as that used in Example 1 was employed. Thus, a 5 nm thick titanium oxide buffer layer 5 was formed by supplying only the carrier gas (Ar) containing Ti source material on the Pt lower electrode 4 at a flow rate of 75 sccm while maintaining the substrate temperature to 400° C. Subsequently, the substrate temperature was elevated to 600° C., and 5 nm thick $Bi_4Ti_3O_{12}$ crystal nuclei layers 6 were formed in the same manner as in Example 1 while changing the flow rate of oxygen gas to (1) 850 sccm, (2) 1,250 sccm, and (3) 1,750 sccm. Then, the substrate temperature was lowered again to 400° C. to form a $Bi_4Ti_3O_{12}$ thin film 7 having a total film thickness of from 100 to 120 nm (FIG. 6).

Figure 2:
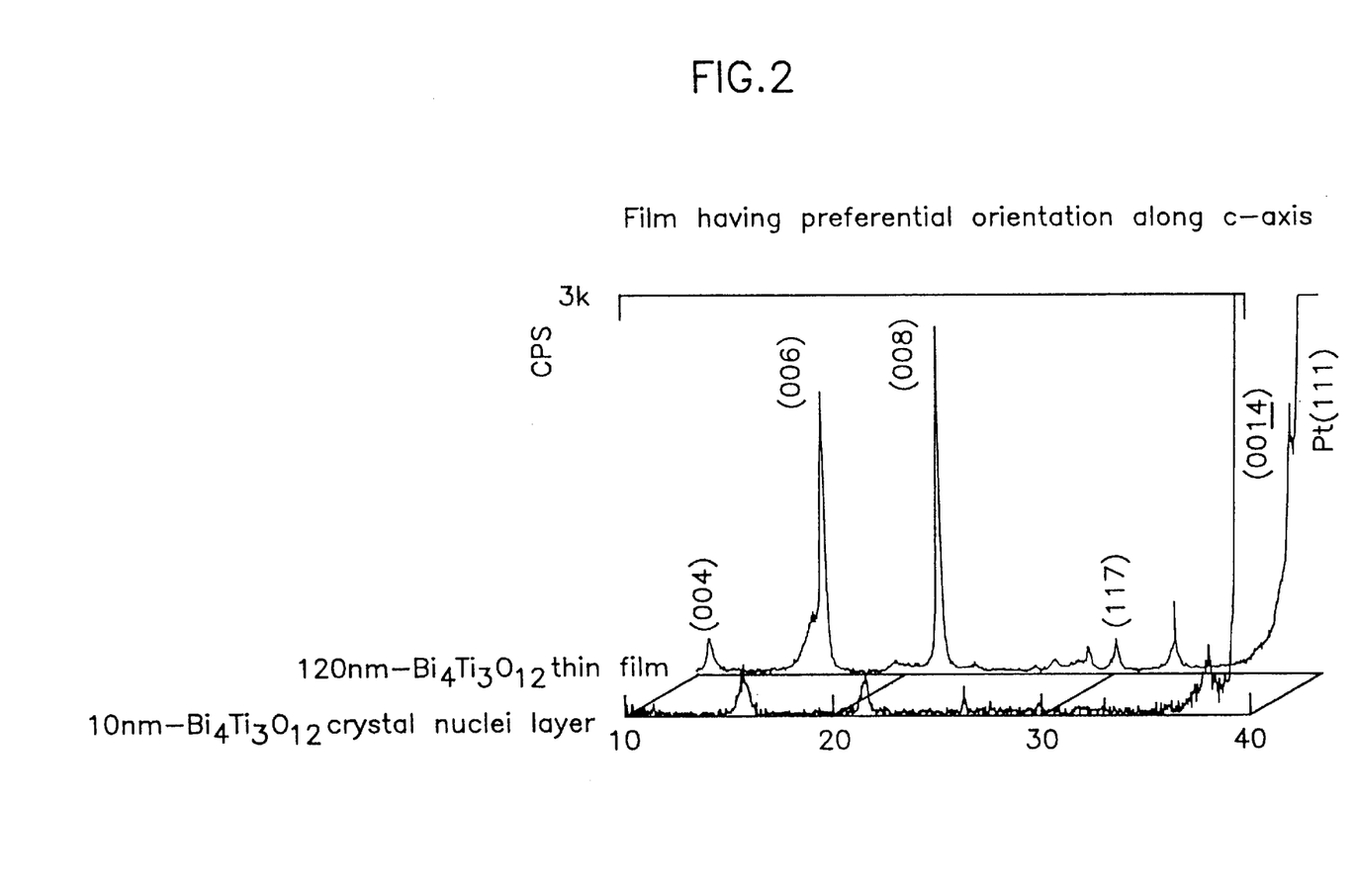
FIG. 2 shows a XRD pattern of the $Bi_4Ti_3O_{12}$ thin film produced in Example 2.
Figure 3:
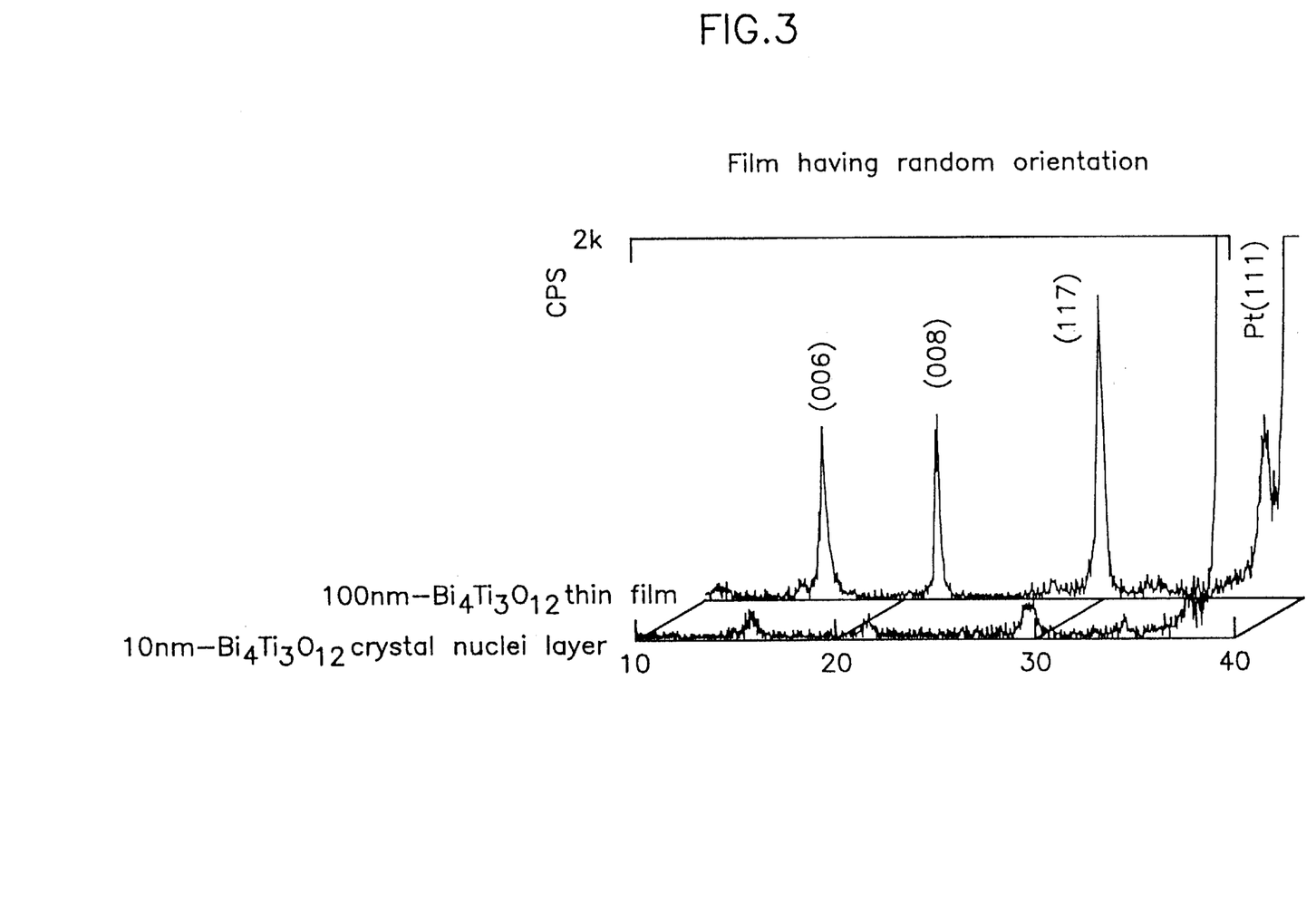
FIG. 3 shows another XRD pattern of the $Bi_4Ti_3O_{12}$ thin film produced in Example 2.
Figure 4:
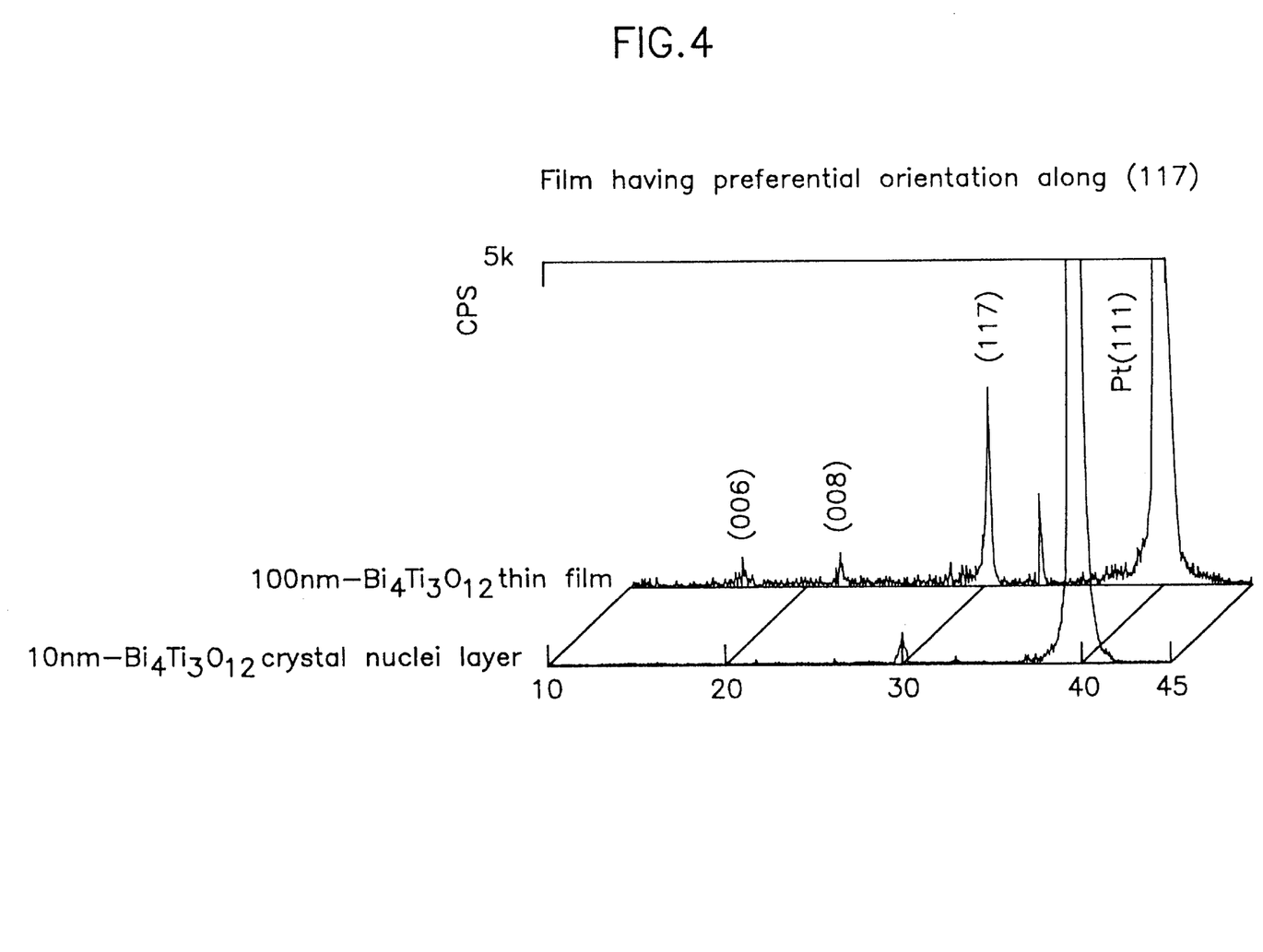
FIG. 4 shows a still other XRD pattern of the $Bi_4Ti_3O_{12}$ thin film produced in Example 2.
Figure 5:
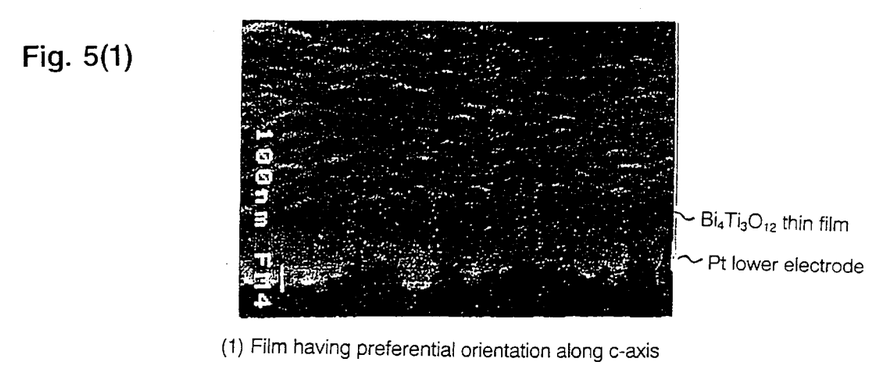

The XRD patterns obtained for the thus prepared samples are given in FIGS. 2 to 4. Even under a temperature as low as 400° C., it is found that $Bi_4Ti_3O_{12}$ thin films inheriting the orientation of each of the underlying crystal nuclei layer are obtained with favorable crystallinity. Thus, corresponding to the results of Example 1, the films thus obtained exhibit the orientation of (1) preferential orientation along c-axis (FIG. 2) ; (2) random orientation (FIG. 3) comprising mixed orientation along c-axis and (117) crystallographic orientation; and (3) preferential orientation along (117)(FIG. 4). Furthermore, the surface morphology as observed in the SEM (scanning electron microscope) photographs of FIGS. 5(1) to 5(3), is found to be very dense and planarized.

It can be seen from the foregoing that extremely dense and planarized $Bi_4Ti_3O_{12}$ thin film having preferential orientation along c-axis is obtained by the present invention. This results by the combined effect of the titanium oxide buffer layer, the crystal nuclei layer, and the low temperature crystal growth at a temperature as low as 400° C. More specifically, the titanium oxide buffer layer increases the generation density of crystal nuclei for the $Bi_4Ti_3O_{12}$ thin film. Then, an extremely thin $Bi_4Ti_3O_{12}$ crystal nuclei layer having excellent crystallinity is formed at a high temperature of 600° C., and the $Bi_4Ti_3O_{12}$ thin film is allowed to grow therefrom at a low temperature. Thus, even at a temperature as low as 400° C., high crystallinity is maintained while suppressing the growth of crystal grains by the low temperature growth process as to result in a dense and planarized $Bi_4Ti_3O_{12}$ thin film above.

As described in the foregoing, the method of forming $Bi_4Ti_3O_{12}$ thin films differing in orientation according to the present example can be effectively controlled to widely obtain films having an orientation along c-axis to those having a random orientation, and further, to those having an orientation along crystallographic (117) direction rich in a-axis component. By further employing a titanium oxide buffer layer and a $Bi_4Ti_3O_{12}$ crystal nuclei layer, a dense and planarized thin film is available by low temperature growth process. Thus, $Bi_4Ti_3O_{12}$ thin films having reduced thickness suitable for low-voltage operation of semiconductor devices and fine processing can be readily obtained.

Capacitors were fabricated by vapor depositing 100-$\mu$m$\phi$ Pt upper electrodes 8 on the upper portion of each of the three types of $Bi_4Ti_3O_{12}$ thin films above differing in orientation.

FIGS. 7(1) to 7(3) each show the ferroelectric hysteresis curve measured by using each of the capacitors. The remanent polarization Pr and the coercive field Ec under an applied voltage of 5V are as follows. In a thin film having preferential orientation along c-axis as shown in FIG. 7(1), Pr=5.6 $\mu C/cm^2$, Ec=55 kV/cm; in a thin film having random orientation as shown in FIG. 7(2), Pr=12 $\mu C/cm^2$, Ec=136 kV/cm; and in a thin film having preferential orientation along (117) as shown in FIG. 7(3), Pr=23.6 $\mu C/cm^2$, Ec=136 kV/cm.

On the other hand, extremely low leak current properties are obtained under the same voltage of 5V. In FIG. 7(1), $I_L$=9.0×10$^{-8}$ A/cm$^2$; in FIG. 7(2), $I_L$=8.0×10$^{-8}$ A/cm$^2$; and in FIG. 7(3), $I_L$=6.5×10$^{-8}$ A/cm$^2$. These results reflect the extremely dense and planarized structure of the ferroelectric thin films obtained in accordance with the present Example.

In accordance with the present Example, favorable ferroelectric properties were available at a film thickness as thin as about 100 to 120 nm, which is in good contrast with the conventional films. More specifically, in a $Bi_4Ti_3O_{12}$ thin film having preferential orientation along c-axis, an Ec as low as Ec=55 kV/cm is realized by reflecting the characteristic small c-axis component of coercive field. In a $Bi_4Ti_3O_{12}$ thin film having preferential orientation along the (117), an extremely high remanent polarization of Pr=23.6 $\mu C/cm^2$ is realized by reflecting the large remanent polarization component in the a-axis direction.

Then, the Bi/Ti composition ratio was obtained by EPMA (electron probe micro analysis) on the three types of $Bi_4Ti_3O_{12}$ thin films obtained above. The following were obtained as a result in good agreement: for a thin film having preferential orientation along c-axis as shown in FIG. 7(1), Bi/Ti=1.35; for a thin film having random orientation as shown in FIG. 7(2), Bi/Ti=1.38; and for a thin film having preferential orientation along (117) as shown in FIG. 7(3), Bi/Ti=1.39. Because the quantity of the starting materials other than oxygen gas supplied during the process was the same, it can be understood that films having a constant composition is obtained while effectively controlling the orientation. This fact is very advantageous in the fabrication of semiconductor devices.

In case of fabricating a semiconductor device in practice, fine processing such as dry etching is performed. However, the etching speed is known to depend on the film composition. That is, in case of dry etching such as reactive ion etching, high frequency electric field is applied to an etching material under a plasma containing gaseous halogen such as F, Cl, Br, etc., so that etching may proceed by forming a low-boiling point halide through the reaction of the gaseous halogen with the elements constituting the etching material.

Thus, if the composition ratio Bi/Ti of the ferroelectric thin film changes, the etching speed may differ depending on the composition. That is, in such a case, it is required to determine the optimum conditions for the etching for each of the films $Bi_4Ti_3O_{12}$ thin film differing in orientation. From the results above, it can be found that the composition ratio Bi/Ti remains constant independent to the film orientation. Accordingly, the conditions of the etching process need not be changed.

EXAMPLE 3

A 100 nm thick $Bi_4Ti_3O_{12}$ thin film having an orientation along c-axis was formed by using the same substrate and the same film formation method described in Example 2. Then, films were formed under the two conditions described below.

That is, a $Bi_4Ti_3O_{12}$ thin film was prepared under the same film formation conditions. Thus, a $Bi_4Ti_3O_{12}$ thin film having a total thickness of 150 nm was formed at a substrate temperature of 400° C. while flowing oxygen gas at a flow rate of 850 sccm. Another $Bi_4Ti_3O_{12}$ thin film having a total thickness of 150 nm was formed at the same substrate temperature of 400° C., but while flowing oxygen gas at an increased flow rate of 1,250 sccm.

Figure 8:
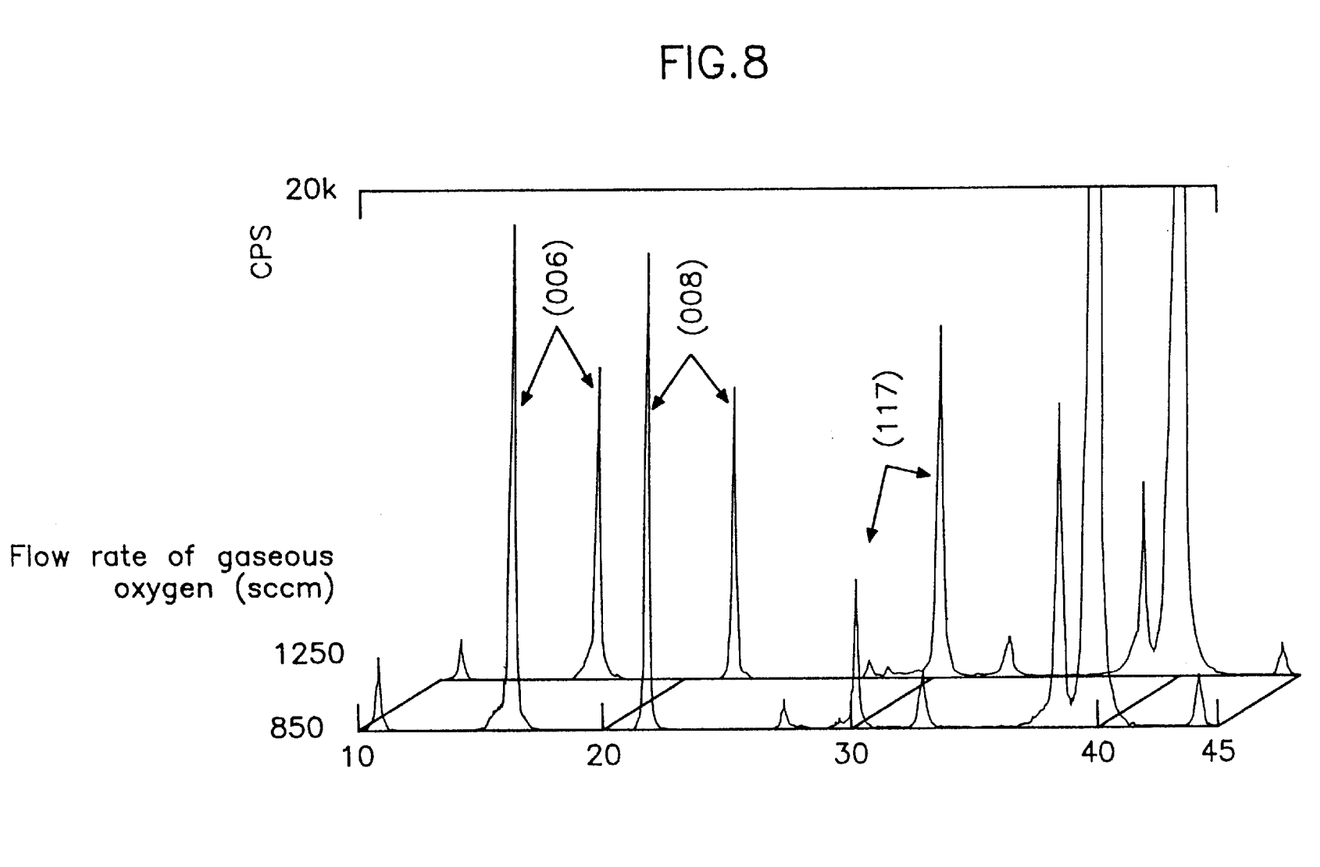
FIG. 8 shows a XRD pattern of the $Bi_4Ti_3O_{12}$ thin film produced in Example 3.

FIG. 8 shows the XRD patterns of each of the thus obtained thin films. It can be seen from the diffractograms that the film formed under a flow of oxygen gas of 850 sccm maintains preferential orientation along c-axis, but that the film obtained by increasing the flow rate to 1,250 sccm during the film formation process exhibits an increase in preferential orientation along (117). These results show that the ratio of the c-axis component to the (117) direction component in film orientation can be controlled by changing the flow rate of oxygen gas. Thus, a structure with high degree of freedom is made available; for instance, a structure having high Pr and a small Ec at the same time can be implemented by interposing a thin film having preferential orientation along (117) between thin films having preferential orientation along c-axis.

EXAMPLE 4

Figure 9:
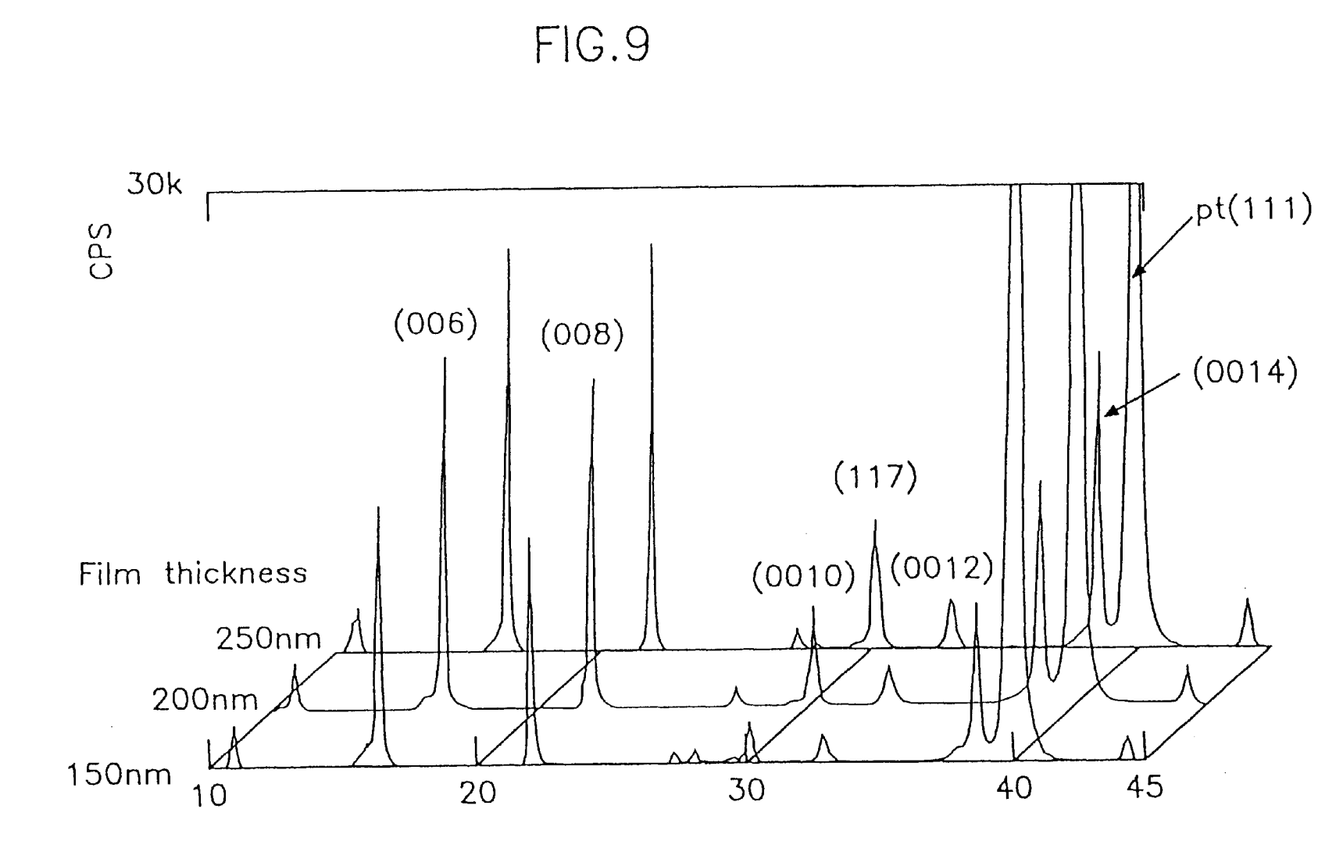
FIG. 9 shows a XRD pattern of the $Bi_4Ti_3O_{12}$ thin film produced in Example 4.

A 100 nm thick $Bi_4Ti_3O_{12}$ thin film having an orientation along c-axis was formed by using the same substrate and the same film formation method described in Example 2. After completing the film formation, $Bi_4Ti_3O_{12}$ thin films each having a total thickness of 150 nm, 200 nm, and 250 nm were prepared by changing the growth temperature to 400° C. and flowing oxygen gas at a rate of 850 sccm. The XRD patterns of the thin films thus obtained are shown in FIG. 9. From FIG. 9, it can be understood that, even in case film growth is once stopped, only the X-ray diffraction intensity increases with increasing film thickness while the film orientation is maintained the same. This result shows that the method of film formation according to the present invention has high reproducibility, and that even in case film formation is interrupted by some trouble or the like, a desired $Bi_4Ti_3O_{12}$ thin film is available by continuing the process again to finally obtain the film at desired thickness. This fact is considerably advantageous in process design.

A method for manufacturing a ferroelectric thin film having a layered perovskite crystal structure of the general formula: $Bi_2A_{m-1}B_mO_{3m+3}$, wherein A is selected from the group consisting of $Na^{1+}$, $K^{1+}$, $Pb^{2+}$, $Ca^{2+}$, $Sr^{2+}$, $Ba^{2+}$ and $Bi^{3+}$, B is selected from the group consisting of $Fe^{3+}$, $Ti^{4+}$, $Nb^{5+}$, $Ta^{5+}$, $W^{6+}$ and $Mo^{6+}$, and m represents an integer of 1 or larger, which comprises introducing into a film formation chamber where a substrate is set, gaseous starting materials inclusive of oxygen gas for forming the ferroelectric thin film in which the flow rate of oxygen gas as one component of the gaseous starting materials is controlled to an arbitrary value necessary for the formation of the ferroelectric thin film having a desired orientation while the pressure inside the film formation chamber and the total flow rate of the gaseous starting materials and an optionally introduced carrier gas are maintained constant.

Particularly in a $Bi_4Ti_3O_{12}$ thin film, orientation of the ferroelectric thin film can be controlled as desired, and yet, with high reproducibility from an orientation along c-axis to that along the crystallographic (117) direction via random orientation. Thus, ferroelectric thin films can be formed effectively to make them suitable for each of the usage of the semiconductor devices, depending on which property is required; i.e., either a large remanent polarization or a small coercive field is required.

Furthermore, by using a titanium oxide buffer layer and a crystal nuclei layer, a dense ferroelectric thin film having a planarized surface is made available at low temperatures. Thus, the generation of leak current attributed to pinholes and the like can be prevented from occurring, so as to realize favorable ferroelectric properties. Thus, the present invention is particularly effective for applications to semiconductor devices which require fine processing, or for lowering the operation voltage.

It is also possible to form film structures in which the ratio for the components having orientation along the crystallographic (117) direction, random orientation, or orientation along c-axis is changed either continuously or continually. This makes it possible to provide ferroelectric thin films matching to the design of semiconductor device, such as in case ferroelectric thin films having large remanent polarization is required, or in case ferroelectric thin films having small coercive electric field is necessary.

Moreover, because the ferroelectric thin film according to the present invention has a constant film composition independent to the orientation, the same etching conditions independent to the orientation can be used in case fine processing such as dry etching is applied thereto. This is extremely advantageous from the viewpoint of process design.

What we claim is:

1. A method for manufacturing a ferroelectric thin film having a layered perovskite crystal structure and having a multi-layered structure of two or more layers, of the general formula: $Bi_2A_{m-1}B_mO_{3m+3}$, wherein A is selected from the group consisting of $Na^{1+}$, $K^{1+}$, $Pb^{2+}$, $Ca^{2+}$, $Sr^{2+}$, $Ba^{2+}$ and $Bi^{3+}$, B is selected from the group consisting of $Fe^{3+}$, $Ti^{4+}$, $Nb^{5+}$, $Ta^{5+}$, $W^{6+}$ and $Mo^{6+}$, and m represents an integer of 1 or larger, which comprises introducing into a film formation chamber where a substrate having an oxide layer as a buffer layer thereon is set, gaseous starting materials inclusive of oxygen gas for forming the ferroelectric thin film in which the flow rate of oxygen gas as one component of the gaseous starting materials is controlled to an arbitrary value necessary for the formation of the ferroelectric thin film having a desired orientation while the pressure inside the film formation chamber and the total flow rate of the gaseous starting materials and an optionally introduced carrier gas are maintained constant.

2. A method according to claim 1, wherein the flow rate of oxygen gas is controlled to an arbitrary value in the range from 20 to 40% by volume with respect to the total flow rate of the gaseous starting materials and the optionally introduced carrier gas, so as to form a $Bi_4Ti_3O_{12}$ ferroelectric thin film having a planarized surface and a preferential orientation along c-axis.

3. A method according to claim 1, wherein the flow rate of oxygen gas is controlled to an arbitrary value in the range from 40 to 60% by volume with respect to the total flow rate of the gaseous starting materials and the optionally introduced carrier gas, so as to form a $Bi_4Ti_3O_{12}$ ferroelectric thin film having a planarized surface and a random orientation mainly containing a c-axis component and a (117) component.

4. A method according to claim 1, wherein the flow rate of oxygen gas is controlled to an arbitrary value in the range from 60 to 80% by volume with respect to the total flow rate of the gaseous starting materials and the optionally introduced carrier gas, so as to form a $Bi_4Ti_3O_{12}$ ferroelectric thin film having a planarized surface and a preferential orientation along (117).

5. A method according to claim 1, wherein a lowermost layer of the ferroelectric thin film is formed with a smaller thickness than its an upper layer and at a higher temperature when the upper layer is formed so as to ensure a crystallinity of the upper layer while suppressing the formation of coarse crystal particles in the upper layer and allowing the ferroelectric thin film to have a planarized surface when the upper layer is formed.

6. A method according to claim 1, wherein the flow rate of oxygen gas is controlled to arbitrary values so as to form the $Bi_4Ti_3O_{12}$ ferroelectric thin film of multi-layered structure including layers having different orientations.

7. A method according to claim 1, wherein the ferroelectric thin film is formed by supplying the heated and volatilized gaseous starting materials onto the heated substrate in the film formation chamber using the carrier gas.

8. A method according to claim 1, wherein the buffer layer contains at least one element constituting the ferroelectric thin film.

9. A method according to claim 1, wherein the buffer layer is a titanium oxide layer of 10 nm or less in thickness and the ferroelectric film has a multi-layered structure of $Bi_4Ti_3O_{12}$ including a lowermost layer formed to a thickness of 10 nm or less at a film formation temperature ranging from 450 to 650° C. and an upper layer formed on the lowermost layer at a film formation temperature ranging from 400 to 500° C.

10. A substrate covered with a ferroelectric thin film formed by the method of claim 1.

11. A capacitor comprising a lower electrode of an electrically conductive material formed on a substrate; a ferroelectric thin film formed on the lower electrode by the method of claim 1; and an upper electrode of an electrically conductive material formed on the uppermost layer of the ferroelectric thin film.

12. A method according to claim 1, wherein each layer in the ferroelectric thin film has the same composition and crystal structure.

* * * * *